United States Patent
Hurwitz

(10) Patent No.: US 10,845,832 B2
(45) Date of Patent: Nov. 24, 2020

(54) VOLTAGE-TO-CURRENT CONVERTER

(71) Applicant: Analog Devices International Unlimited Company, Limerick (IE)

(72) Inventor: Jonathan Ephraim David Hurwitz, Edinburgh (GB)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/562,141

(22) Filed: Sep. 5, 2019

(65) Prior Publication Data

US 2020/0081465 A1 Mar. 12, 2020

Related U.S. Application Data

(60) Provisional application No. 62/729,171, filed on Sep. 10, 2018.

(51) Int. Cl.
*G05F 1/56* (2006.01)
*G06F 1/08* (2006.01)
*G01R 11/56* (2006.01)

(52) U.S. Cl.
CPC ............... *G05F 1/561* (2013.01); *G06F 1/08* (2013.01); *G01R 11/56* (2013.01)

(58) Field of Classification Search
CPC ............ G05F 1/561; G06F 1/08; G01R 11/56
See application file for complete search history.

(56) References Cited

U.S. PATENT DOCUMENTS

| | | |
|---|---|---|
| 5,317,279 A | 5/1994 | Zarabadi et al. |
| 5,341,087 A | 8/1994 | Van |
| 5,444,446 A | 8/1995 | Gopinathan et al. |
| 5,739,678 A | 4/1998 | Nagaraj |
| 6,324,083 B1 | 11/2001 | Thus et al. |
| 7,514,999 B2 | 4/2009 | Killat |
| 9,164,526 B2 | 10/2015 | Pan et al. |
| 9,350,297 B2 * | 5/2016 | Su .......... H03D 7/1441 |
| 10,095,252 B2 | 10/2018 | Jain |
| 2007/0172013 A1 | 7/2007 | Naviasky et al. |

(Continued)

FOREIGN PATENT DOCUMENTS

| | | |
|---|---|---|
| CN | 110888479 A | 3/2020 |
| JP | 2891297 | 9/1996 |
| JP | 3557110 | 11/1998 |

OTHER PUBLICATIONS

"European Application Serial No. 19196183.8, Extended European Search Report dated Jan. 23, 2020", 7 pgs.

(Continued)

*Primary Examiner* — Dinh T Le

(74) *Attorney, Agent, or Firm* — Schwegman Lundberg & Woessner, P.A.

(57) ABSTRACT

A voltage-to-current converter can be configured to generate a current based on an input voltage and for part of the time use the generated current as the output current of the voltage-to-current converter, and for part of the time use the generated current as a current source for the operation of the voltage-to-current converter. This arrangement can reduce the need for high performance current mirror circuits within the voltage-to-current converter, thereby reducing the cost and complexity of the voltage-to-current converter and improving precision and accuracy.

23 Claims, 14 Drawing Sheets

(56) References Cited

U.S. PATENT DOCUMENTS

2012/0001659 A1  1/2012  Balmelli
2014/0266110 A1  9/2014  Yuan et al.

OTHER PUBLICATIONS

"European Application Serial No. 19196183.8, Office Action dated Apr. 14, 2020", 6 pgs.

"European Application Serial No. 19196183.8, Response filed Jun. 22, 2020 to Office Action dated Apr. 14, 2020", 16 pgs.

Torelli, G., et al., "Tracking switched-capacitor CMOS current reference", IEEE Proc. Circuits Devices Syst., 145(1), (Feb. 1998), 44-47.

* cited by examiner ial Application Ser. No. 62/729,171, titled "VOLT-
VOLTAGE-TO-CURRENT CONVERTER

CLAIM OF PRIORITY

This application claims the benefit of priority of U.S. Provisional Application Ser. No. 62/729,171, titled "VOLTAGE-TO-CURRENT CONVERTER" to Jonathan Ephraim David Hurwitz, filed on Sep. 10, 2018, the entire contents of which being incorporated herein by reference.

BACKGROUND

Millions of utility electricity meters are deployed globally each year for calculating energy consumption of premises for billing, in addition to many sub-metering devices used for monitoring applications. These devices are typically calibrated at the factory prior to deployment, and then continuously measure consumption of electricity over their deployment lifetime, without interruption to the act of measurement. Annually a percentage of these meters are removed, re-tested for accuracy in labs, to estimate the accuracy distribution of the greater population in the field, to decide if complete removal of the population is needed, but the accuracy of each individual meter is largely unknown, and annually millions of perfectly accurate meters are replaced, while in instances inaccurate meters can be left operating in the field.

Utility meter accuracy monitoring systems may be implemented as part of the utility meter to help in determining and monitoring the accuracy of the meter. These systems typically include a number of different electronic circuits/modules, including one or more voltage-to-current converters, which may be use to generated one or more current reference signals.

SUMMARY

The present disclosure relates to a voltage-to-current (V-to-I) converter system. The voltage-to-current converter system is configured to generate a current based on an input voltage and for part of the time use the generated current as the output current of the voltage-to-current converter system, and for part of the time use the generated current as a current source for the operation of the voltage-to-current converter system. This arrangement may reduce the need for high performance current mirror circuits within the voltage-to-current converter system, thereby reducing the cost and complexity of the voltage-to-current converter system and improving precision and accuracy.

Whilst the voltage-to-current converter is described in the context of utility meter accuracy monitoring, it will be appreciated that this is merely one example use of the voltage-to-current converter. It may alternatively be used in any other context or system where voltage-to-current conversion is required.

In a first aspect of the present disclosure, there is provided a V-to-I converter system for converting an input voltage to an output current, the V-to-I converter comprising a V-to-I conversion unit configured to convert the input voltage to a first current and a second current; wherein for a first portion of a clock cycle, the output current comprises the first current and for at least part of the remainder of the clock cycle, the first current is used as a current source for the V-to-I conversion unit.

The V-to-I conversion unit may be further configured to convert the input voltage to a second current, wherein for a second portion of the clock cycle, the output current comprises the second current and for at least part of the remainder of the clock cycle, the second current is used as a current source for the V-to-I conversion unit. The first portion of the clock cycle may be different to the second portion of the clock cycle.

The first portion of the clock cycle may be approximately 50% of the clock cycle and the second portion of the clock cycle is the remaining approximate 50% of the clock cycle.

The a V-to-I conversion unit may be further configured to convert the input voltage to a third current, wherein for a third portion of the clock cycle, the output current comprises the third current and for at least part of the remainder of the clock cycle, the third current is used as a current source for the V-to-I conversion unit. The first portion of the clock cycle, second portion of the clock cycle and third portion of the clock cycle may all be different.

The first portion of the clock cycle may be approximately 33% of the clock cycle, the second portion of the clock cycle may be approximately 33% of the clock cycle and the third portion of the clock cycle may be approximately the remaining 33% of the clock cycle.

It will be appreciated that the V-to-I converter system may be configured to convert the input current to a plurality of currents (for example two currents—the first current and the second current—or three currents—the first current, the second current and the third current—or fourth currents, etc). The output current may comprise each of the plurality of currents at different times during the clock cycle (for example, interleaving the plurality of currents at the output), such that a continuous output current is achieved. At time of the clock cycle when one or more of the plurality of currents is not used as the output current, those one or more current may be used as a current source(s) for the V-to-I conversion unit.

The V-to-I converter system of any preceding claim, further comprising a current steering stage configured to: steer the first current to the output of the V-to-I converter system during the first portion of the clock cycle and steer the first current to act as the current source for the V-to-I conversion unit for at least part of the remainder of the clock cycle; and steer the second current to the output of the V-to-I converter system during the second portion of the clock cycle and steer the second current to act as the current source for the V-to-I conversion unit for at least part of the remainder of the clock cycle.

The V-to-I conversion unit may further comprise a first capacitor and a second capacitor, and wherein the V-to-I conversion system is configured such that when the first current is acting as the current source for the V-to-I conversion unit, the first capacitor is charged by the first current, and when the second current is acting as the current source for the V-to-I conversion unit, the second capacitor is charged by the second current.

The V-to-I conversion unit may further comprise at least one an integrator circuit configured to generate a control voltage based at least in part on one or more of: the input voltage and a voltage across the first capacitor (for example, the difference between the input voltage and the voltage across the first capacitor) and/or the input voltage and a voltage across the second capacitor (for example, the difference between the input voltage and the voltage across the second capacitor).

The at least one integrator circuit may be configured to configured to integrate a first charge accumulated on the first capacitor and a second charge accumulated on the second capacitor.

The V-to-I conversion unit may be configured such that the integrator circuit integrates the first charge during at least part of the second period and integrates the second charge during at least part of the first period.

The V-to-I conversion unit may further comprise a transconductance stage configured to generate the first current and the second current based at least in part on the control voltage.

The V-to-I conversion unit may be configured to generate the first current and the second current based further on current output from a DAC.

In a second aspect of the disclosure, there is provided a method of using a V-to-I converter system to convert an input voltage to an output current at an output terminal of the V-to-I converter system, the method comprising: converting, using a V-to-I conversion unit of the V-to-I converter system, the input voltage to a first current; and during a first portion of a clock cycle, steering the first current to the output terminal of the V-to-I converter system and during at least part of the remainder of the clock cycle, steering the first current so as to be used as a current source for the V-to-I conversion unit.

The method may further comprise: converting, using the V-to-I conversion unit of the V-to-I converter system, the input voltage to a second current; and during a second portion of the clock cycle, steering the second current to the output terminal of the V-to-I converter system and during at least part of the remainder of the clock cycle, steering the second current so as to be used as a current source for the V-to-I conversion unit.

The method may further comprise converting, using a V-to-I conversion unit of the V-to-I converter system, the input voltage to a third current, and during a third portion of the clock cycle, steering the third current to the output terminal of the V-to-I converter system and during at least part of the remainder of the clock cycle, steering the third current so as to be used as a current source for the V-to-I conversion unit.

The first portion of the clock cycle may be approximately 50% of the clock cycle and the second portion of the clock cycle may be the remaining approximate 50% of the clock cycle.

In a third aspect of the present disclosure, there is provided a V-to-I converter system configured to convert an input voltage to an output current, the converter comprising: a V-to-I conversion unit comprising: a first capacitor; a second capacitor; a first input for receiving a first input current; a second input for receiving a second input current; a third input for receiving the input voltage; a first output for outputting a first current; and a second output for outputting a second current, wherein the V-to-I conversion unit is configured to generate the first current and the second current based on the input voltage and charges accumulated in the first capacitor and second capacitor; and a switch stage configured to: receive the first current and the second current; steer the first current to the first input of the V-to-I conversion unit during a first portion of a clock cycle in order to charge the first capacitor during the first portion of the clock cycle and steer the first current to an output terminal of the V-to-I converter system during at least part of the remaining portion of the clock cycle; and steer the second current to the second input of the V-to-I conversion unit during a second portion of the clock cycle in order to charge the second capacitor during the second portion of the clock cycle and steer the second current to the output terminal of the V-to-I converter system during at least part of the remaining portion of the clock cycle; wherein the output current is the current output from the output terminal of the V-to-I converter system.

The V-to-I conversion unit may further comprise an integrator configured generate a control voltage by: integrating a difference between the input voltage and a voltage across the first capacitor during at least part of the first portion of the clock cycle; and integrating a difference between the input voltage and a voltage across the second capacitor during at least part of the second portion of the clock cycle.

The V-to-I conversion unit may further comprise a transconductance stage configured to generate the first current and a second current based at least in part on the control voltage.

The first portion of the clock cycle may be approximately 50% of the clock cycle and the second portion of the clock cycle may be approximately the remaining 50% of the dock cycle.

DRAWINGS

The present disclosure is described, by way of example only, with reference to the following drawings.

DESCRIPTION

Figure 1:
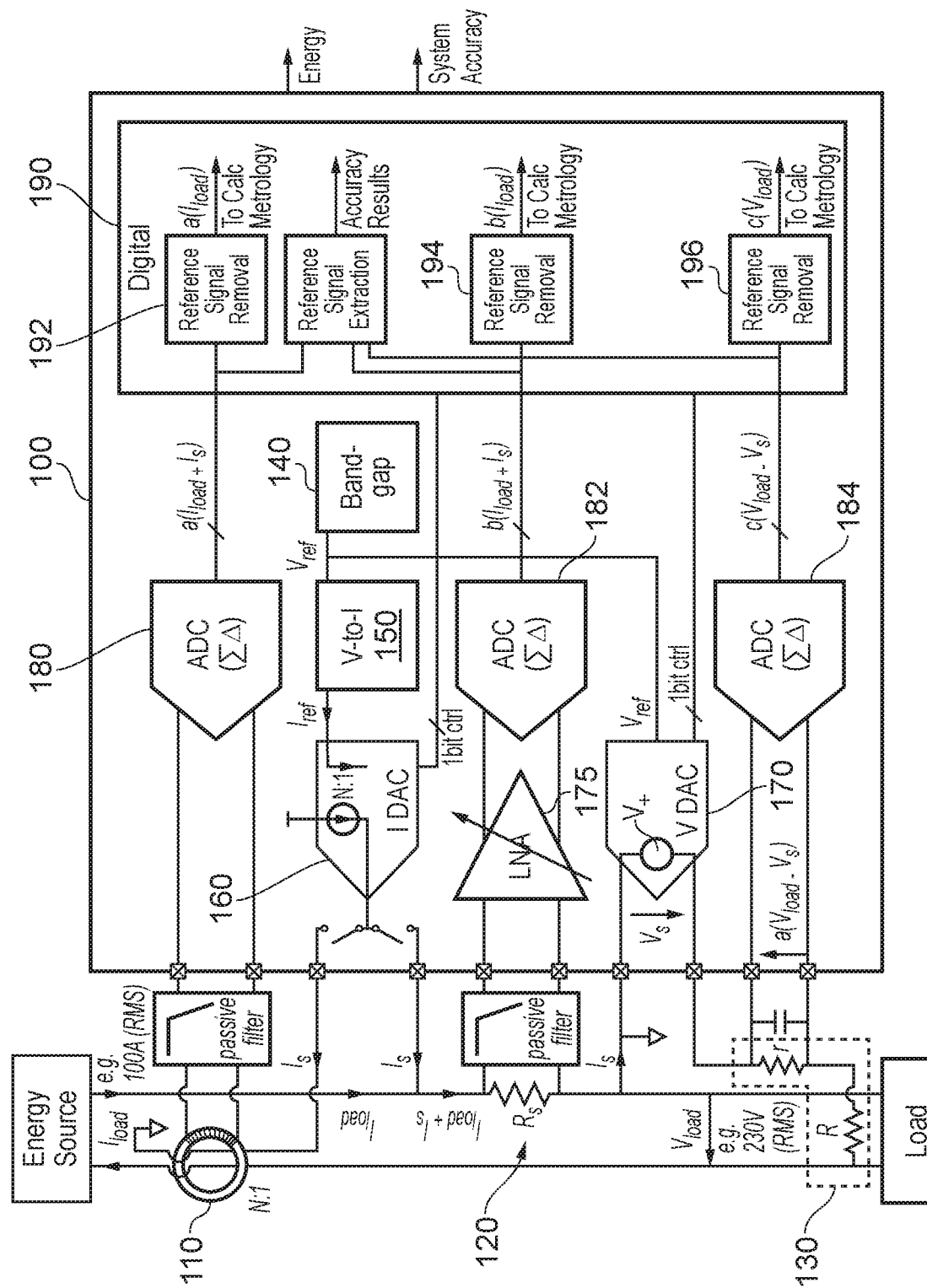
FIG. 1 shows an example system configured for monitoring of the accuracy of a utility electricity meter.

This disclosure relates particularly to a voltage-to-current (V-to-I) converter system to convert an input voltage into an output current. The V-to-I converter system is configured to generate a current based on the input voltage that is directly used for both the output current of the V-to-I converter system and also as a current source for the operation of the V-to-I converter system. In particular, for part of the time (for example, for part of a clock cycle/period), the generated current is used as the output current of the V-to-I converter system, and for part of the time (for example, the remaining part of the clock cycle/period), the generated current is directly used as a current source for the V-to-I converter system (i.e., no current mirrors are used to copy the generated current to create the source current—the generated current is instead directly used as the source current). Consequently, compared with other V-to-I converter systems, accuracy and precision may be improved, because errors in the copied current used for a current source in other V-to-I converter systems are avoided, and the cost and complexity of the system may be reduced.

Where it is desired to have a continuous output current from the V-to-I converter system (and not an intermittent output current), the V-to-I converter system may be configured to operate in a 'ping-pong' way. In particular, the V-to-I converter system may be configured to generate at least two currents—for example a first current and a second current—based on the input voltage. For part of the time (for example, for a first portion of a clock cycle, such as for 50% of the clock cycle), the first current may be the output current of the V-to-I converter system, during which time the other currents (such as the second current) may act as a current source(s) to the V-to-I converter system. For another part of the time (for example, for a second portion of a clock cycle, such as for the remaining 50% of the clock cycle), the second current may be the output current of the V-to-I converter system, during which time the other currents (such as the first current) may act as a current source to the V-to-I converter system. In this way, the output current may be a continuous current that is based on the input voltage, formed by interleaving the plurality of currents such that at each generated current forms the output current for a different portion of the clock cycle. The generated plurality of currents are also directly used as current sources for the V-to-I converter system at times when they are not being used for the output current. This implementation may be particularly useful where a continuous, stable current reference is required.

This application presents a complete energy measurement frontend device with integrated background accuracy monitoring (Condition Based Monitoring CbM) of the full system including the sensors. This device can continuously monitor the accuracy of the energy measurement function, over the lifetime of the product, without interruption to the act of measurement. It includes monitoring of the sensors (for example, current sensors) in the system, external to the IC, which are typically the largest source of error and drift in accuracy.

This accuracy monitoring may be achieved by injection of a small signal, with known amplitude, phase, and frequency characteristics, by the measurement frontend into the sensor during the act of normal current and voltage measurement, and the presence and measurement of this signal is used to determine the accuracy of the full signal chain including the gain of the sensors in the background.

Realising this technology involves three main challenges: first, the creation of a highly stable and accurate reference signal, both voltage and current, and developing a means to drive this reference as a deterministic signal into the sensors in a stable and accurate way; second, by overcoming the large dynamic range challenges of stimulating, detecting and accurately measuring the reference stimulation signal from load, where the load current and voltage may be 100s of Amps or 100s of Volts, and the stimuli signal may be in the order of 10s of mA, and 100s of mV (due to practical signal levels possible from CMOS and the local supply); and third, by digital signal processing and signal phase and frequency automatic selection and adjustment to be able to stimulate, extract and remove this signal accurately. This application describes circuit techniques developed in overcoming the first two challenges, and will only explain the high-level requirements of the third, as it is more related to signal processing rather than circuits.

FIG. 1 shows a system 100 (for example, a measurement frontend of an electric meter) configured for monitoring of the accuracy of sensors (a current transformer (CT) 110, a shunt resistor 120 and a voltage sensor 130) and the measurement components/modules. The system 100 may be implemented as an integrated circuit, or in any other suitable way. In this implementation, the frontend is designed to measure voltage using the voltage sensor 130 comprising a potential divider R and r, phase current using the shunt resistor 120 (having a resistance Rs), and neutral return current using the CT 130, as it typical is single-phase metering devices. The phase current and voltage are used for energy accumulation, while the neutral current is used for detection of failure or lost current in the system or potential theft of electricity.

The system 100 comprises reference signal stimulators that are attached to the individual sensors. The reference signal stimulators comprise a band-gap voltage reference 140, a voltage to current converter 150, a current DAC 160 and a voltage DAC 170 and are configured, in combination with a control signal ('1 bit ctrl', output from a digital signal processor, DSP 190), to inject of a small reference signal, with known amplitude, phase, and frequency characteristics, during the act of normal current and voltage measurement, which can then be used to determine the accuracy of the full signal measurement chain including the gain of the sensors in the background. In the case of all the sensors, the reference signal travels through the exact same signal path as the load signal the system is trying to measure, and the reference signal is of the same type of signal as the load signal of interest. In the case of the current sensors 110 and 120, the reference signal is a current ($I_s$), and in the case of the voltage divider, the reference signal is a voltage ($V_s$).

The system 110 also comprises a measurement frontend, comprising ADCs 180, 182 and 184 (all sigma-delta ADCs in this example, although any other suitable type of ADC may be used). When looking at the input of the measurement frontend, the signal seen by each channel is a combination of the load signal of interest ($I_{load}$ or $V_{load}$) and the reference signal ($I_s$ or $V_s$) which is created by the system 100 itself to learn the characteristics of the sensors. The reference signals are then detected in the digital domain by the DSP 190, and removed using the reference signal removal modules/blocks 192, 194 and 196 from the signal chain before the ADC data is forwarded for the main metrology function in the system (i.e. signals a($I_{load}$), b($I_{load}$) and c($V_{load}$) are forwarded for metrology calculation elsewhere in the DSP 190 or system 100.

In this system 100, the load current $I_{load}$ can have a full scale up to about 100 A RMS, and the typical line voltage be around 230V RMS, while the stimulation signal may be at, for example, 16 mA for the current channels and 100 mV for the voltage channel. In this case, it may be desirable to extract the signal to within about 0.1% (137 dB for current and 106 dB for voltage)). The huge dynamic range difference between these signals, places the stimulation signal in the noise floor of the measurement circuitry. The stimulation signals in this example are dual level signals, with variable frequency and phase, adjusted by the digital system, with well controlled transitions between the high and low levels. The digital system 190 may automatically adjust these parameters depending on the environment on the line, meaning in effect the stimulation signal drivers are 1-bit current in-and-out or voltage in-and-out DACs. It may be desirable to maintain the fidelity and stability of the signal through this chain through the lifetime of the product, the bandgap voltage stability, the V-to-I transimpedance stability, and the driver circuits gain stability while driving various signal patterns, throughout the lifetime of the product.

Figure 2:
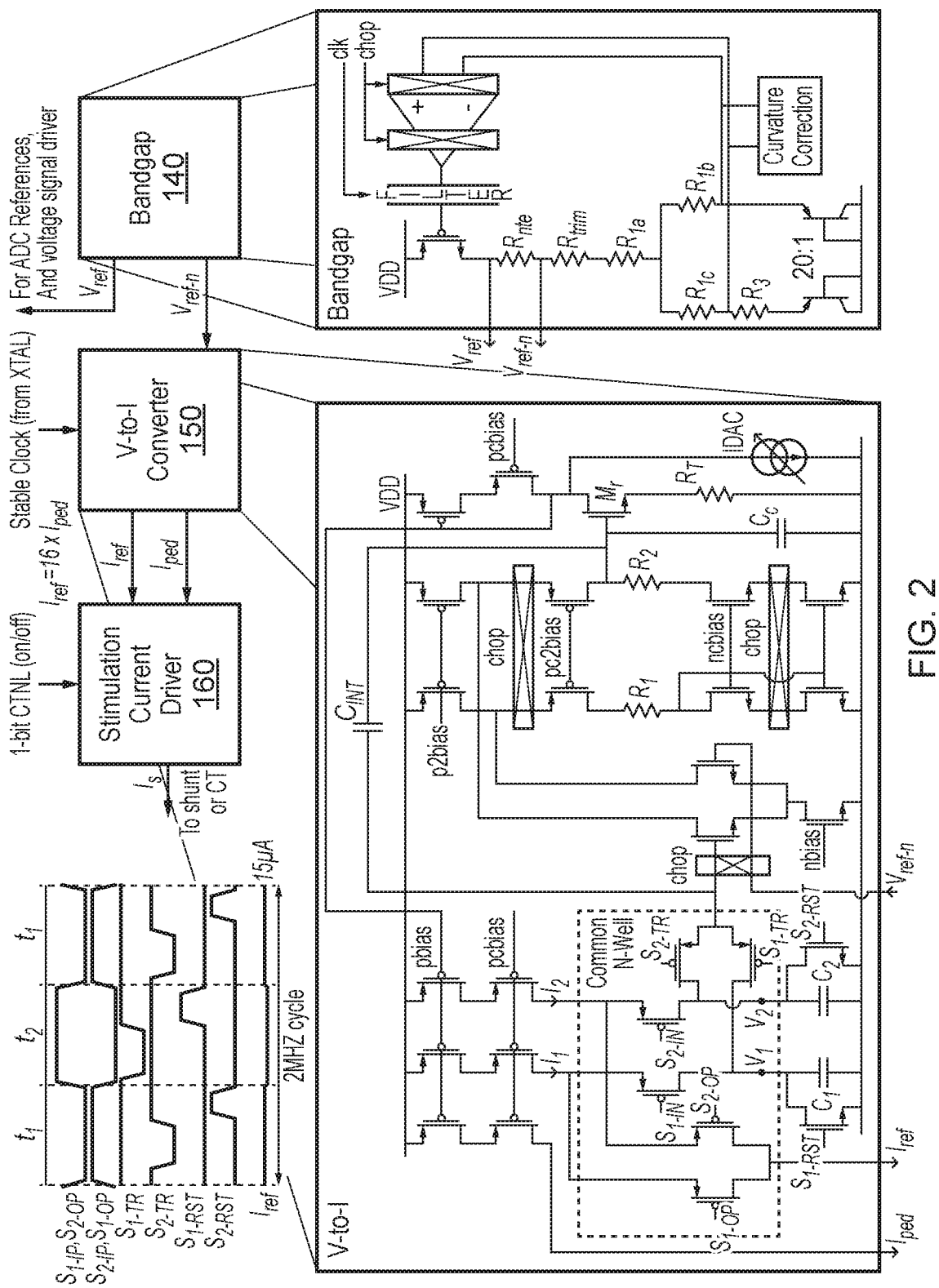
FIG. 2 shows a schematic diagram of an example implementation of a V-to-I conversion system in accordance with an aspect of the present disclosure.

FIG. 2 shows example details of the signal chain used for the stimulation signal to drive the current sensors. First, a stable reference voltage is created using the bandgap 140. This particular bandgap comprises a chopped substrate PNP bandgap reference with the addition of an additional tap-off voltage, $V_{ref-n}$, although any suitable type of voltage reference circuit may alternatively be used. This voltage is then converted to a stable 15 uA current reference using the V-to-I circuit 150, which has been devised by the inventor of the present disclosure. Finally, this current is modulated and amplified to up to ~30 mA stimuli via a current driver 160. Any suitable circuit well understood by the skilled person may be used to implement the current driver 160.

The example bandgap 140 represented in FIG. 2 contains curvature correction, chopping and filtering, and has two outputs above the trim ($R_{trim}$) resistor, one ($V_{ref}$) with a flat TC to drive the ADC and Voltage drivers and one ($V_{ref-n}$) with a small negative temp coefficient to match the positive temperature coefficient of the capacitors used in the next stage. Many other topologies of bandgap could alternatively be used.

Turning to the example implementation of the V-to-I converter system 150 represented in FIG. 2, a stable external crystal reference clock is available in this system 100 (although any other type of reference clock signal may be used by the V-to-I converter system 150). The reference clock have a frequency of, for example ~2 MHz, which is used to alternately charge two 7 pF capacitors, $C_1$ and $C_2$ (which may be metal-metal capacitors, or any other type of capacitor), using currents $I_1$ and $I_2$, (via FETs $S_{1-IP}, S_{2-IP}$) and then discharge (using FETs $S_{1-RST}, S_{2-RST}$) them in the opposite phase when the same currents are used for the output (via FETs $S_{1-OP}, S_{2-OP}$). In between charging and discharging, the charge on each capacitor is transferred (using FETs $S_{1-TR}$, $S_{2-TR}$) to the integrator (which comprises the integrator capacitor, $C_{INT}$). This allows error integration of the difference in charge from the final voltage the capacitors $C_1$ and $C_2$ finish at versus the desired $V_{ref-n}$ voltage at the input of the chopped folded cascode amplifier, whose output drives a degenerated NMOS transconductor that provides the error top-up (~20%) current to the resistor derived DAC (~80%) current. The DAC is set at manufacturing to be close to the optimum balance point of the output of the integrator, so that the residual input referred error is minimal. The loop ensures that the average ($I_1/2+I_2/2$) current charging successively each capacitor $C_1$ and $C_2$ to $V_{ref-n}$ is what defines the reference current and the ping-pong operation (i.e., the alternate switching between the first current $I_1$ and the second current $I_2$) ensures the output current $I_{ref}$ is directly from the same current sources used for charging the caps $C_1$ and $C_2$ and doesn't involve any mirroring, in contrast to the circuit disclosed in the paper "Tracking switched-capacitor CMOS current reference", G. Torelli and A. de la Plaza, IEE Proc.-Circuits Devices Syst, Vol. 145, No. 1, February 1998, pages 44-47. This choice may enable a very cost effective stable current without the need for high performance process options for super stable resistors or transistors. Now that a reference current signal $I_{ref}$ is created by the V-to-I circuit 150, this signal may be driven out into the shunt 120 and CT 110 using the reference signal driver 160.

More general principles of the V-to-I conversion system 150 may be appreciated with reference to FIGS. 7-14.

Figure 7:
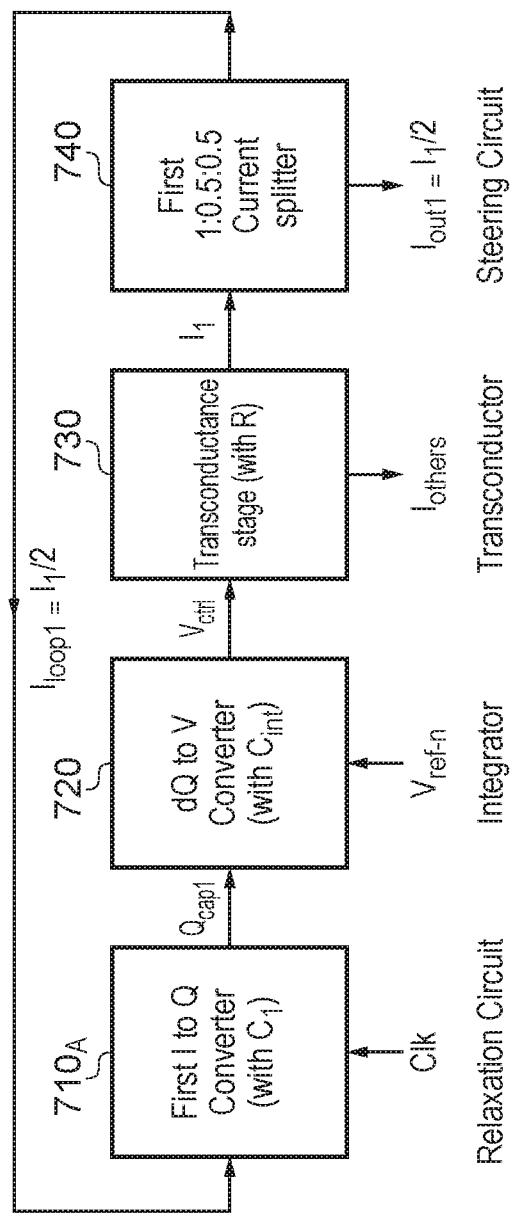
FIG. 7 shows a further example representation of part of a V-to-I conversion system in accordance with an aspect of the present disclosure.

FIG. 7 shows an example block diagram of a first loop of the V-to-I conversion system 150 for generating a first output current component $I_{out1}$, which in the example operation implementation described below has an average current of $I_1/2$. The V-to-I conversion system 150 is configured to generate a steady current $I_1$ based on an input reference voltage $V_{ref-n}$. Whilst in the specific implementation of FIG. 2, $V_{ref-n}$ is derived from the bandgap, it will be appreciated that $V_{ref-n}$ may be any type of voltage signal that is derived or generated in any suitable way.

The first loop of the V-to-I conversion system represented in FIG. 7 comprises a first current to charge converter 710$_A$—a charge relaxation circuit—configured to receive a first loop current $I_{loop}$, which in the example operation implementation described below has an average current of $I_1/2$ and a clock signal Clk and generate a first charge transfer $Q_{cap1}$.

Figure 8:
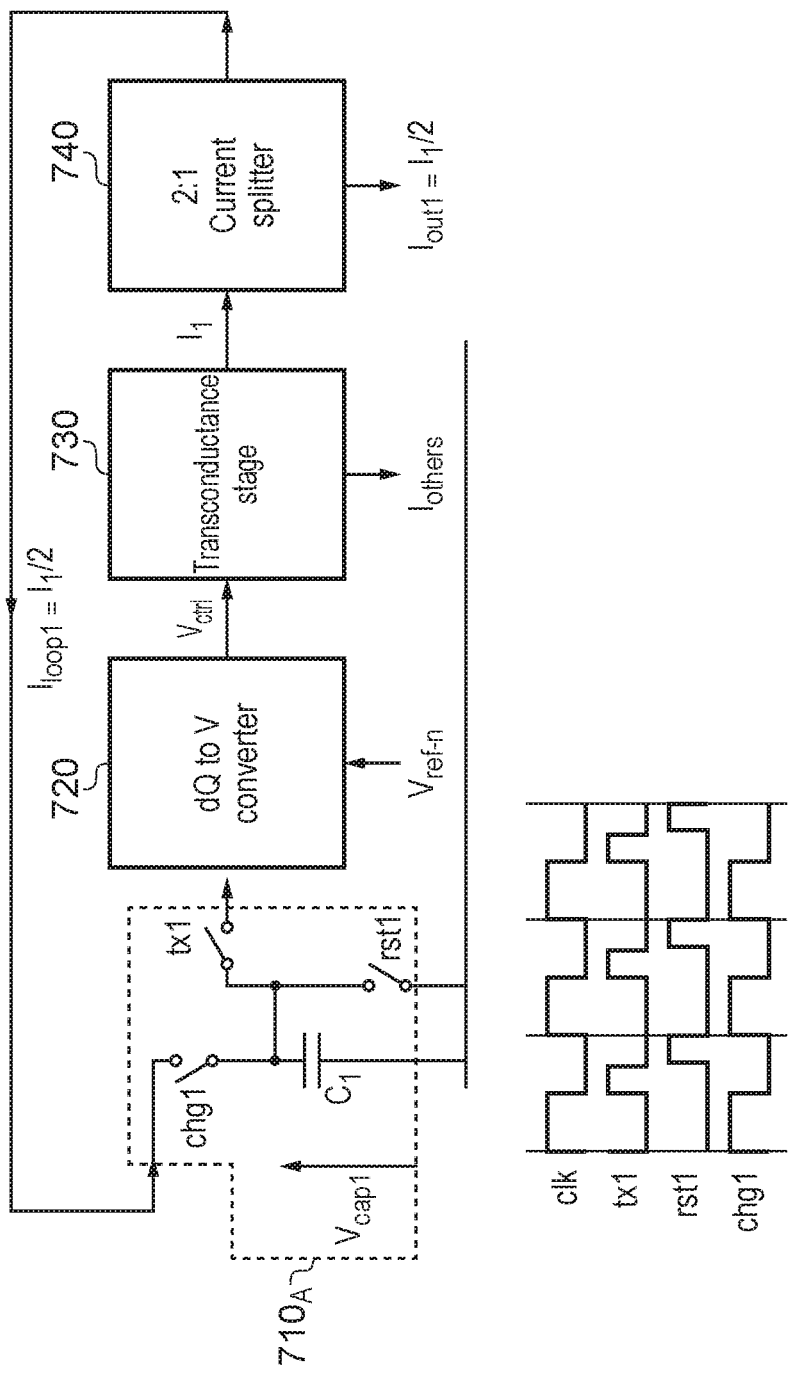
FIG. 8 shows further example details of the V-to-I conversion system of FIG. 7.

FIG. 8 shows an example configuration of the first current to charge converter 710$_A$, to assist in understanding the operation of the first current to charge converter 710$_A$. The first capacitor $C_1$ corresponds to $C_1$ represented in FIG. 2, the first charge control switch chg1 corresponds to FET $S_{1-IN}$ in FIG. 2, the first transfer control switch tx1 corresponds to FET $S_{1-TR}$ in FIG. 2 and the first reset switch rst1 corresponds to FET $S_{1-RST}$ in FIG. 2. The clock signal Clk is used to control operation of capacitor charging, charge transfer and capacitor reset. The first capacitor $C_1$ is charged for a first portion of the clock cycle/period (in this example operation implementation, the first portion is about 50% of the clock cycle), for example by controlling opening and closing of the first charge control switch chg1 with Clk. After charging, the voltage $V_{cap1}$ across $C_1$ is equal to $I_{loop1} \cdot t/C_1$, where t=the charging time (i.e., about 50% of the period of Clk). If the frequency of Clk were, for example 1 MHz, the clock cycle/period of Clk would be about 1 μs, such that the charging time t would be about 500 ns. After charging, chg1 is opened and the stored charge $Q_{cap1}$ is then transferred out by closing tx1 for about ¼ of the cycle of Clk. Finally, $C_1$ is fully discharged in the final ¼ of the cycle of Clk by opening tx1 and closing rst1. This charge, transfer, reset cycle is continually repeated. By way of non-limiting example, $C_{Ik1}$ may have a frequency of 1 MHz and $C_1$ may equal 7 pF. Furthermore, whilst the transfer and reset times in this example each last for ¼ of the cycle of Clk, they may alternatively take different proportions of the remaining cycle time after charging of $C_1$ is complete.

The first loop of the V-to-I conversion system of FIG. 7 further comprises an integrator 720, or charge (dQ) to voltage converter, configured to receive the first charge transfer $Q_{cap1}$ and the reference voltage $V_{ref-n}$ and generate a control voltage $V_{ctrl}$.

Figure 9:
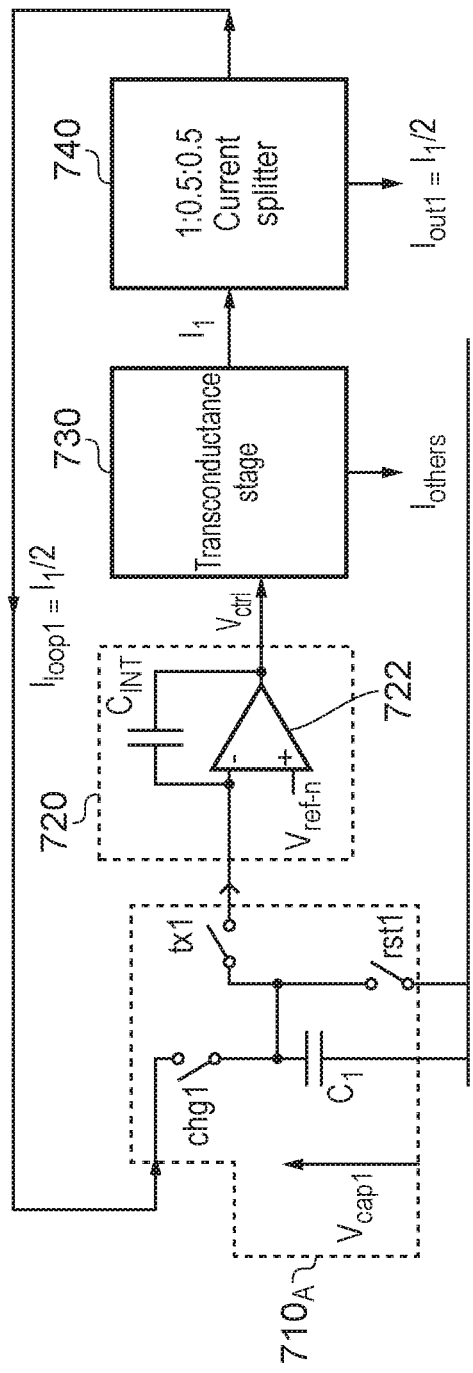
FIG. 9 shows further example details of the V-to-I conversion system of FIG. 7.
Figure 9:
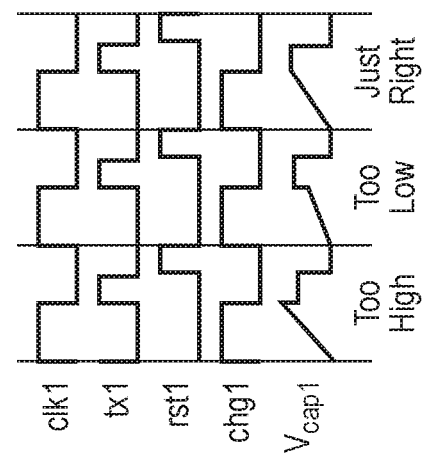

FIG. 9 shows an example implementation of an error integrator stage 720, although it will be appreciated that any suitable integrator may be used to perform this function. The charge $Q_{cap1}$ transferred to the integrator during the transfer ¼ cycle may be equal to $dQ=(V_{cap1}-V_{ref-n})/C_1$. The integrator 820 may then integrate a difference between the voltage $V_{cap1}$ (generated by the charge $Q_{cap1}$ on the capacitor $C_1$) and the desired voltage $V_{ref-n}$ to generate the control voltage $V_{ctrl}$. As can be seen, when over time $V_{cap1}$ settles to equal $V_{ref-n}$, then $V_{ctrl}$ remains steady (i.e., it no longer moves). By way of non-limiting example, $V_{ref-n}$ may be set to approximately 1.12V for this particular implementation, although any other suitable voltage may alternatively be used. Likewise, any suitable value for $C_{INT}$ may be used. The example implementation represented in FIG. 7 includes an amplifier 722, which may optionally comprise a chopped NMOS input folded cascode, although it will be appreciated that the integrator 720 may be implemented in any other suitable components.

The first loop of the V-to-I conversion system of FIG. 7 then comprises a transconductance stage 730 (which may also be referred to as a V to I converter sub-circuit) configured to convert $V_{ctrl}$ to the current $I_1$.

Figure 10:
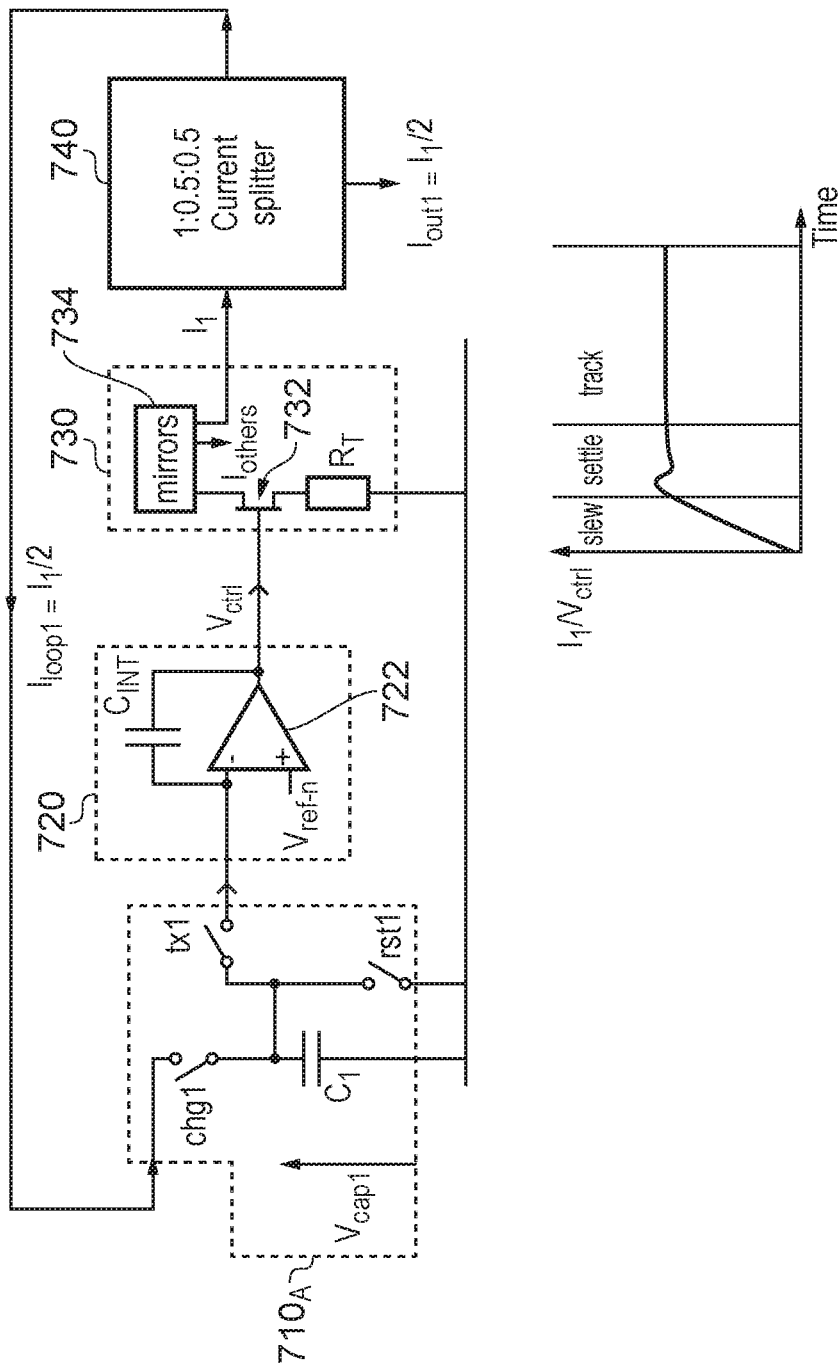
FIG. 10 shows further example details of the V-to-I conversion system of FIG. 7.

FIG. 10 shows an example implementation of the transconductance stage 730 comprising a transistor 732 and a resistor $R_T$ operating as a transconductor to convert Vctrl to a current. The transconductance stage 730 also comprises one or more current mirrors 734 to generate I1 based on the transconductor current, such that $V_{ctrl}$ is converted to I1. The current mirrors 734 may be implemented using any suitable circuit. In one alternative implementation, the current mirrors 734 may be omitted from the transconductance stage 730, with $I_1$ being taken directly from the transconductor.

In one example implementation, the frequency of the clock cycle may be about 1 MHz, the charging time t may be about 500 ns, $C_1$ may approximately 7 pF and $V_{ref-n}$ is approximately 1.12V and $I_1$ should be approximately 15.7 µA. Optionally, a second current $I_{others}$ may be output from the transconductance stage 730 to other devices. Any errors in transconductance of the transconductance stage 730 may be minimised by integrator gain of the integrator 720. As can be seen from the graph in FIG. 10, a steady first current $I_1$ is generated by the V transconductance stage 730 based on $V_{ctrl}$. After the first loop of the V-to-I conversion system locks to the correct, steady $I_1$, $V_{ctrl}$ should track changes due to environmental conditions and/or 1/f noise. The transistor 732 represented in FIG. 10 corresponds to $M_T$ in FIG. 2.

Finally, the first loop of the V-to-I conversion system of FIG. 7 comprises a first current splitter $740_A$. The first current splitter $740_A$ is configured to split $I_1$ in order to steer $I_1$ to the first current-to-charge converter 710 for the first portion of the clock cycle of Clk and to the output $I_{out}$ for the rest of the clock cycle of Clk.

Figure 11:
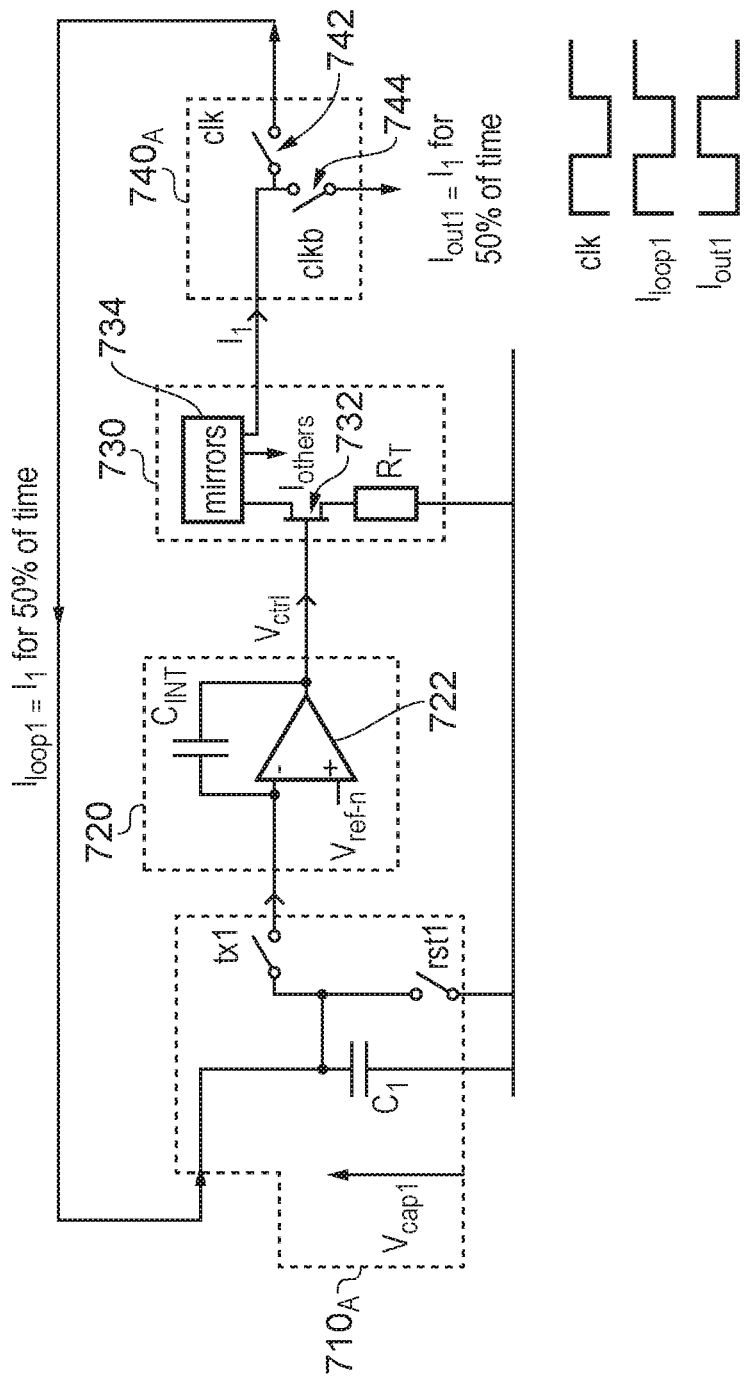
FIG. 11 shows further example details of the V-to-I conversion system of FIG. 7.

FIG. 11 shows an example implementation of the first current splitter $740_A$, which comprises two current steering switches 742 and 744—one switch 742 is controlled by the clk signal and the other switch 744 is controlled by the inverse, clkb, of the clk signal. In this example, the switch 742 replaces the switch chg1 in the first current to charge converter $710_A$, as it effectively performs the same function. In an alternative, the switch 742 may be omitted from the first current splitter $740_A$ and the first current to charge converter $710_A$ may comprise the switch chg1, and the first loop of the V-to-I conversion system will still operate in the same way. Therefore, the switch 742 controlled by the clk signal corresponds to $S_{1\text{-}IN}$ in FIG. 2 and the switch 744 controlled by the inverse signal clkb corresponds to $S_{1\text{-}OP}$ in FIG. 2. Since in this example the clk signal has a duty cycle of about 50%, for approximately half of the cycle, $I_{out1}=I_1$ and for the other approximately half of the cycle, $I_{loop}=I_1$. By splitting $I_1$ in this way, it is possible to directly use the converted current $I_1$ both as the output current of the V-to-I conversion system 150 and as the current source for charging the capacitor $C_1$ of the first current to charge converter $710_A$. This means that the mirroring circuits utilised by previous V-to-I conversion systems to mirror the generated current so that the generated current could be used as the output current and the mirrored current could be used for charging a capacitor(s), are not required. The mirroring circuits used in previous V-to-I converters may introduce an error in the copied current because of mismatch between the transistors used for generating the first current $I_1$ and the mirroring currents. Consequently, the current splitting employed by the V-to-I conversion system 150 of the present disclosure may improve the precision and accuracy of the output current over temperature, voltage and time. However, the output $I_{out1}$ is equal to $I_1$ for only a first portion of the clock cycle of Clk (in this example, about 50% of the clock cycle), and is zero for the rest of the time, which may be an issue when the V-to-I conversion system 150 is intended to convert a steady input voltage, $V_{ref-n}$ to a steady current $I_{ref}$.

Figure 12:
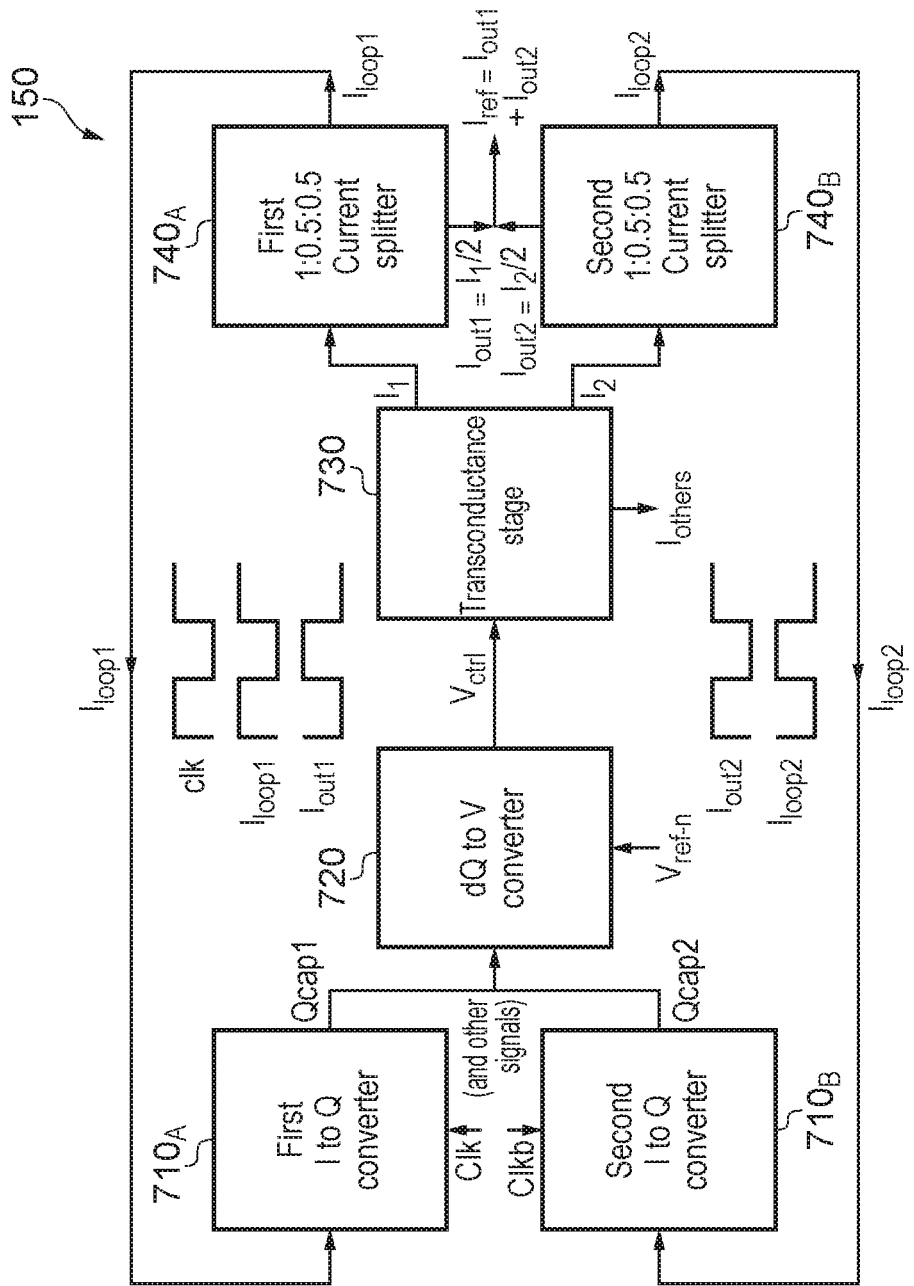
FIG. 12 shows a further example representation of a V-to-I conversion system in accordance with an aspect of the present disclosure.
Figure 13:
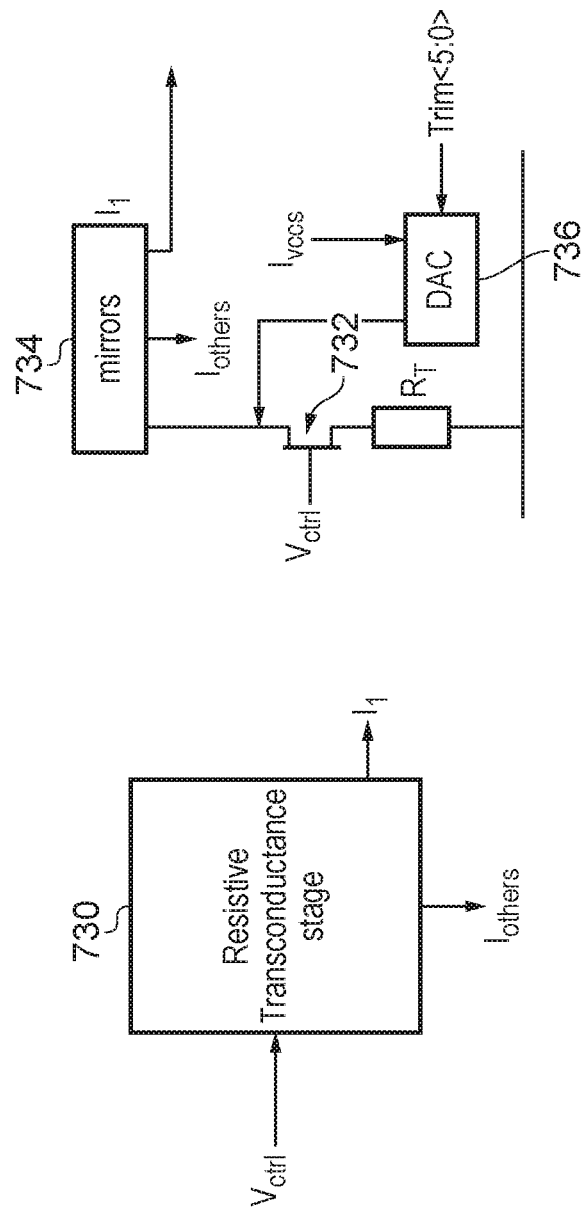
FIG. 13 shows further example details of the V-to-I conversion system of FIG. 7 and FIG. 12.

Therefore, a second, out of phase, loop may be introduced, as represented in FIG. 12. The second loop comprises a second current to charge converter $710_B$, which may be very similar to the first current to charge converter $710_B$, but comprises a second capacitor $C_2$ (that is charged by the current $I_{loop2}$) and is controlled by the inverse clock signal Clkb. Therefore, during the charging time of $C_1$, the charge $Q_{cap2}$ on $C_2$ may be transferred and discharged, and during the transfer and discharge time of $C_1$, $I_{loop2}$ may charge $C_2$. The integrator 720 may be configured as described above. The transconductance stage 730 may be configured as described above, except that it is configured to output two currents $I_1$ and $I_2$ (for example, the current mirrors 734 may be configured to output currents $I_1$ and $I_2$ and optionally also one or more other current $I_{others}$). If $C_1$ and $C_2$ are the same size (within device tolerances), $I_1$ and $I_2$ should be similar to each other, with any small mismatch being caused by $C_1$ and $C_2$ mismatch and transistor mismatch in current mirror circuits. The second current splitter $740_B$ may be very similar to the first current splitter $740_A$, but may be configured to steer $I_2$ to $I_{out2}$ when $I_1$ is being steered to $I_{loop1}$ and configured to steer $I_2$ to $I_{loop2}$ when $I_1$ is being steered to $I_{out1}$. $I_{out1}$ and $I_{out2}$ may then be straightforwardly combined such that the output current of the V-to-I conversion system 150 is a continuous current $I_{ref}=I_{out1}+I_{out2}$. By alternating (i.e., ping-ponging) between the two out of phase loops in this way, a continuous output current $I_{ref}$ may be achieved, whilst still using the current output from the transconductance stage 730 as both the output of the V-to-I conversion system 150 and as the current source for charging the capacitors $C_1$ and $C_2$. Any mismatch in $I_1$ and $I_2$ due to transistor mismatch should not affect the average output current, only the ripple in the output current. Likewise any mismatch in $C_1$ and $C_2$ should only introduces a ripple and the current $I_{ref}$ is defined by the average of $C_1$ and $C_2$ FIG. 13 shows some additional optional features of the transconductance stage 730, which may be used to further improve the characteristics of the V-to-I conversion system 150 when used to generate a steady reference output current. In this example, the transconductance stage 730 further comprises a DAC 736 to provide additional, quiescent current to the converter and thereby increase the loop gain. For example, it may be configured to provide approximately 80% of the current required by the transconductance stage 730 (although it may alternatively provide any other amount), with the remainder coming from the transconductor driven by $V_{ctrl}$. This means that to achieve a desired output current from a particular input voltage (for example, to convert a $V_{ref-n}$ input signal of about 1V to an output current $I_{out}$ of about 1 mA), less gain will be required from the integrator 720 and the transconductor (for example, reducing the required size of $R_T$). For example, if the desired current output is 1 mA for a Vref-n of 1V, the quiescent current generated by the DAC 736 may be set to 0.9 mA, for example, thereby requiring only about 0.1 mA to be provided by the transconductor. The range of the DAC 736 may be set by a bias current IVCCS, which may be set by a voltage reference (such as Vref from the voltage reference 140) and a unit resistor. The DAC value (i.e., the digital input value, which is labelled Trim<5:0> in FIG. 13) may be set to achieve a particular quiescent current output from the DAC 736 once at production to the 'balance point' of the integrator 720 (for example, the point at which the integrator has the least offset, to reduce residual and temperature dependent errors). By using the transductor to provide the remaining current, temperature drift of the DAC 736 and noise of the other circuits within the loop may be compensated by the transductor current. A DAC is also used in the same way in the example representation of the V-to-I converter system 150 in FIG. 2. Optionally, a comparator (not represented in FIG. 13) may be used to trim the DAC to help achieve the optimum value. In an alternative, a quiescent current may be generated and set in any other suitable way and used in the transconductance stage 730 as described above.

Figure 14:
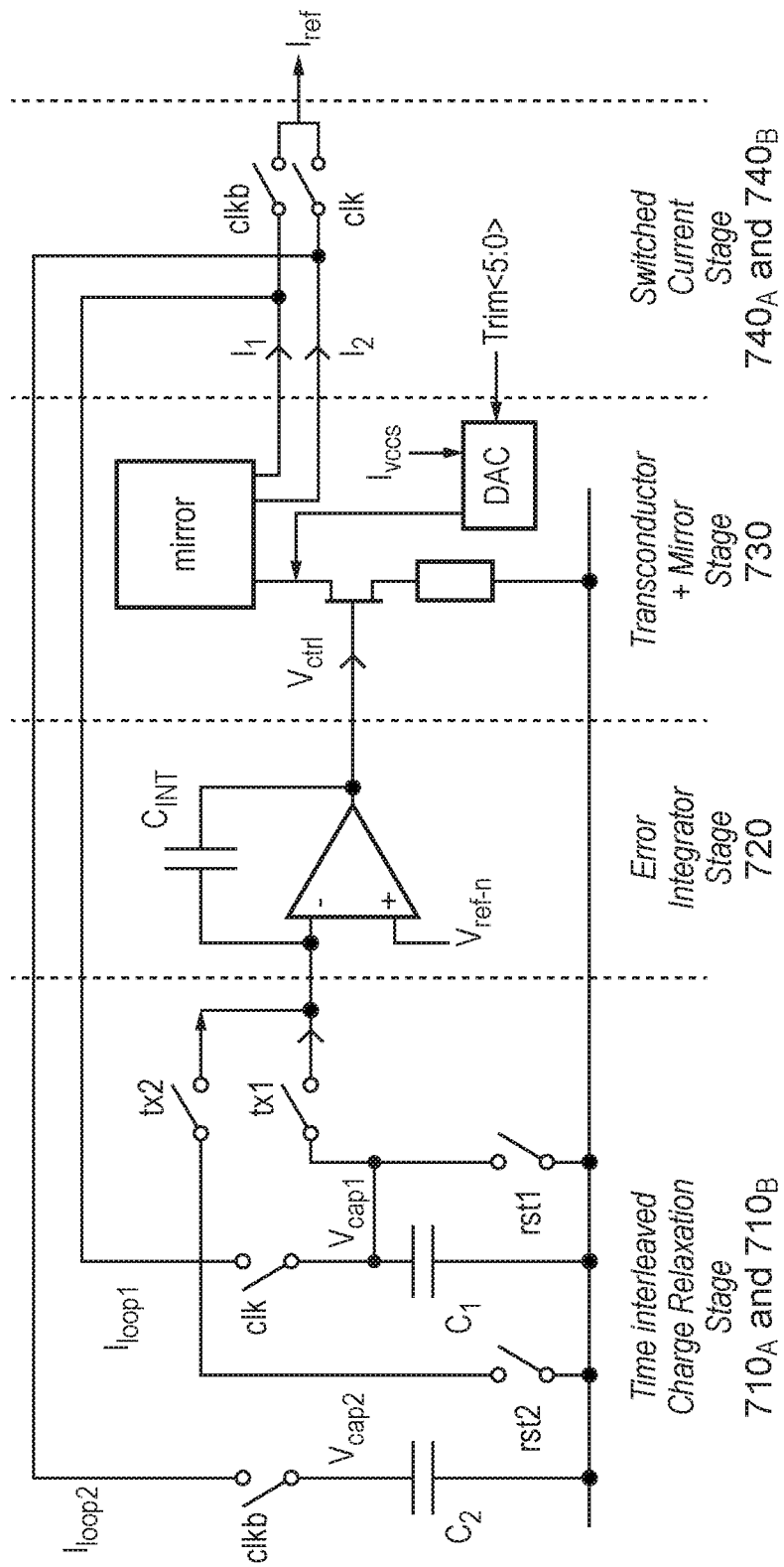
FIG. 14 shows further example details of the V-to-I conversion system of FIG. 12.

FIG. 14 shows a further representation of the V-to-I conversion system 150 in accordance with this disclosure.

It will be appreciated that the above describes one particular implementation of the V-to-I conversion system 150 and that various alternatives may be implemented. For example, more than two loops may be utilised in order to generate $I_{ref}$. For example, a third loop comprising a third current to charge converter and a third current splitter may be used. The first output current $I_1$ may be output to $I_{ref}$ for the first ⅓ of the clock cycle (e.g., approximately 33% of the clock cycle) and for at least part of the remaining ⅔ of the clock cycle $I_1$ may be steered to $I_{loop1}$ to charge $C_1$. The second output current $I_2$ may be output to $I_{ref}$ for the second ⅓ of the clock cycle (e.g., approximately 33% of the clock cycle) and for at least part of the remaining ⅔ of the clock cycle, $I_2$ may be steered to $I_{loop2}$ to charge $C_2$. A third output current $I_3$ may be steered by the third current splitter output to $I_{ref}$ for the final ⅓ of the clock cycle (e.g., approximately 33% of the clock cycle) and for at least part of the remaining ⅔ of the clock cycle, $I_3$ may be steered to a third $I_{loop3}$ to charge a third capacitor $C_3$ of the third current to charge converter. Thus, $I_{ref}$ may be generated using a plurality of current loops, where the current of each output loop contributes to Iref for a different portion of the clock cycle (i.e., interleaving). Furthermore, three or more capacitors may be shared between loops, for example there could be three capacitors and two currents $I_1$ and $I_2$ output by the transconductance stage 730. In this case, the current splitters 740 could be configured such that $I_1$ is used sometimes to charge $C_1$, sometimes $C_2$, and sometimes $C_3$, while $I_2$ is used sometimes to charge $C_2$, sometimes $C_3$, and sometimes $C_1$, in such a way that $I_1$ and $I_2$ spend largely equal periods being created based on all three capacitors so that any mismatch in the 3 capacitors is spread.

Another variation is that it is possible to take the V-to-I conversion system 150 described above to generate more than one controlled current, for example to generate $I_{ref1}$ and $I_{ref2}$ by having three loops with three currents $I_1$, $I_2$ and $I_3$ to charge three capacitors $C_1$, $C_2$, and $C_3$. In the first ⅓$^{rd}$ of the clock cycle, it may be configured to have $I_1$ go to $I_{ref1}$, $I_2$ go to $I_{ref2}$ and $I_3$ be used to charge C3. In the second ⅓$^{rd}$ of the clock cycle, it may be configured to have $I_2$ go to $I_{ref1}$, $I_3$ go to $I_{ref2}$ and $I_1$ be used to charge $C_1$. In the final ⅓$^{rd}$ of the clock cycle, it may be configured to have $I_3$ go to $I_{ref1}$, $I_1$ go to $I_{ref2}$ and $I_2$ be used to charge $C_2$. In this way $I_{ref1}$ and $I_{ref2}$ both have an average of $I_1$, $I_2$ and $I_3$, and the currents $I_1$, $I_2$ and $I_3$ are also used in the switched capacitor current control loop to charge the capacitors $C_1$, $C_2$ and $C_3$.

Furthermore, each of the capacitor and current loops may not be the same. For example, $C_1$ and $C_2$ may be such that $C_2$ is nominally two times larger in value than $C_1$, and the transconductance stage 730 may be configured such that $I_2$ is nominally two times larger in value than $I_1$. This could be used to create multiple weighted currents in one voltage-to-current conversion system.

Furthermore, each portion of the clock cycle may not be of equal length of time. For example, the first portion may equal approximately 75% of the clock cycle, such that $I_1$ is steered to $I_{ref}$ for approximately 75% of the clock cycle and steered to $I_{loop1}$ for at least part of the remaining 25%. The second portion may equal approximately 25% of the clock cycle, such that $I_2$ is steered to $I_{ref}$ for approximately 25% of the clock cycle and steered to $I_{loop2}$ for at least part of the remaining 75%. This may be achieved in any suitable way, for example by using a clock that does not have a 50% on, 50% off duty cycle (for example, it may instead have an approximately 75% on, 25% off duty cycle). It will be appreciated that these are non-limiting examples of the relative length of the first portion and the second portion and they may alternatively be set to any relative lengths that are suitable for the particular implementation and/or use of the V-to-I converter system 150. Furthermore, throughout this disclosure the terms 'approximately' and 'about' are used to in reference to the relative lengths of the first portion and second portion (for example, the first portion is approximately 50% of the clock cycle of Clk). In this context, 'approximately' and 'about' is intended to mean, to within the tolerances and accuracy of the clock signal state transitions (for example, transitions from 0 to 1 and vice-versa) and switching circuit performance. For example, a first portion that is approximately 50% of the clock cycle may be within +/−1% (such as between 49-51%), or +/−2% (such as between 48-52%), or within +/−5% (such as between 45-55%).

It can be seen that it is possible with combinations of these techniques and variations on these techniques to generate, with the same integrator 720, multiple current outputs $I_1$, $I_2$, etc, with the same or different weightings for each.

The voltage-to-current converter system 150 may be can be driven by a fixed frequency clock Clk or by a variable frequency clock Clk, to change the value of current $I_{ref}$, for example for trim or to track the frequency of operation.

The voltage-to-current converter system 150 may receive a voltage (e.g., $V_{ref-n}$) which has largely a different and, potentially opposite, temperature coefficient to the temperature coefficient of the capacitors $C_1$ and $C_2$ used in the voltage-to-current converter system 150.

The current to charge converters 710$_A$ and 710$_B$ (i.e., the relaxation circuits), the integrator 720 and the transconductance stage 730 may together be viewed as a V-to-I conversion unit comprising $C_1$ and $C_2$ and configured to receive $I_{loop1}$, $I_{loop2}$ (as current sources), an input voltage for conversion $V_{ref-n}$, and output currents $I_1$ and $I_2$ that are generated based on the input voltage. Whilst 710A, 710B, 720 and 730 represent one way in which the V-to-I conversion unit may be implemented, it should be appreciated that the V-to-I conversion unit may be implemented in any other suitable way wherein $C_1$ is charged by $I_{loop1}$ and $C_2$ is charged by $I_{loop2}$, and $I_1$ and $I_2$ are generated based at least in part on $V_{ref-n}$ and the charges accumulated by $C_1$ and $C_2$ each clock cycle. The implementation described above and represented in the Figures is merely one example.

Figure 3:
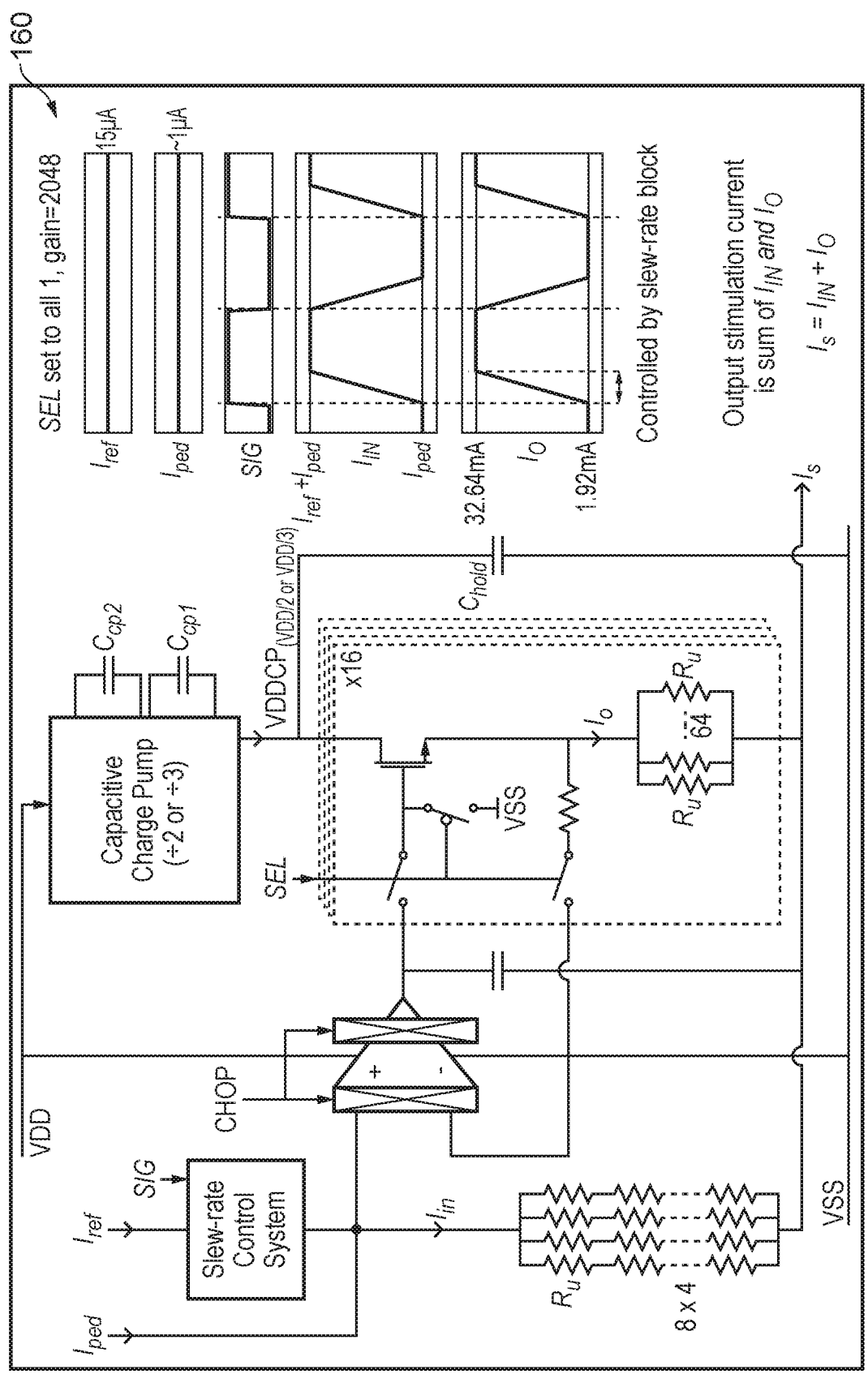
FIG. 3 shows a schematic diagram of an example current reference signal driver circuit.

FIG. 3 shows an example implementation of a current reference signal driver circuit that may optionally be used to convert the reference current into a signal, performing a similar function to the I DAC 160. However, it will be appreciated that the V-to-I conversion system 150 of the present disclosure is suitable for use for any other purpose. In this instance, the output signal are dual level signals, in the frequency range of 10 s of Hz to 1 kHz, with adjustable slope rate. The circuit may attempt to deliver the largest output current level possible, while consuming the least amount of power. The actual power delivery needs are quite small, due to the low impedance of the sensors. The compliance needs of the output stage compliance may be set by the signal swing on the sensor which can move positive or negative with $I_{load}$, and the headroom needed by the driver to stably amplify and deliver the modulated current. Hence, in this example, a split supply topology is deployed, in which the reference signal creation and frontend driver operate off a 1.8V supply, but a lower supply is created efficiently using a capacitive charge pump to deliver the larger current on the output of the driver following amplification. The driver is a current multiplier based on a resistively defined chopped opamp current copier, that outputs through a common node that attaches to the sensor. There is an input resistor that takes an input current $I_{in}$ to generate a voltage $V_{in}$ above the voltage of the output, and an amplifier that drives the control terminal (the gate) of an NMOS to ensure that the voltage on the output resistor above the common node of the output is also at $V_{in}$. The ratio of the two resistors defines the current multiplication. To achieve, for example, 30 mA peak output from a 15 uA input requires a very large ratio of about 2000:1. This may be built up carefully, firstly with 16 legs to the output path each having 64 unit resistors in parallel, and secondly with an arrangement of 4 parallel legs of 8 series unit resistors on the input, that are equivalent to 2 unit resistors but evenly distributed throughout the array, giving a ratio of 2*16*64=2048. The legs of the output can be switched off to give different ratios for different applications.

The $I_{in}$ to the current amplifier is a combination of a modulated very stable $I_{ref}$ and a pedestal current $I_{ped}$ (~$I_{ref}$/16), which may be there to ensure the input and output of the current amplifier are operating well and have some mVs and mAs, when the $I_{ref}$ is modulated to zero. The modulation may be achieved through a slew-rate control circuit that linearly controls the slew-rate so that a large di/dt is not generated that could cause EMI issues.

For the current measurement path (e.g., ADC 180 and ADC 182), the small shunt input (typically about 140μΩ) presents the most challenging signal path due to the magnitude of the signal from the sensors 110 and 120, the dynamic range challenges introduced by the relative magnitude of the reference current signal versus the load current signal, and the common-mode rejection requirements.

Figure 4:
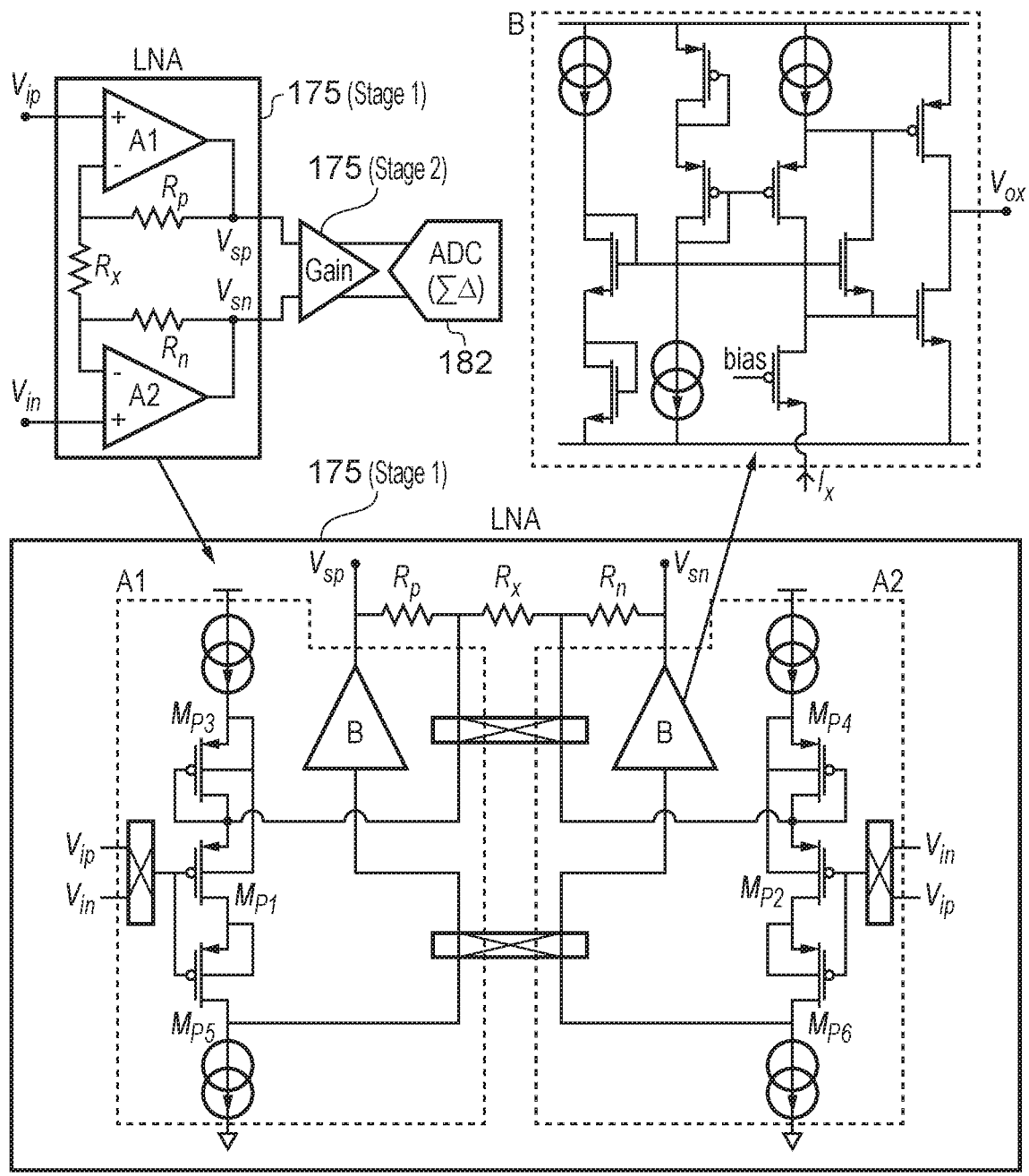
FIG. 4 shows a schematic diagram of an example low-noise high-impedance input, programmable current feedback instrumentation amplifier.

FIG. 4 shows an example representation of a low-noise high-impedance input, chopped current feedback instrumentation amplifier topology 175 (LNA), which may be used to amplify and drive the ADC 182. Whilst a particular LNA 175, devised by the inventor, has been represented in this example, the LNA 175 is not the subject of the present application and any suitable and any suitable LNA may alternatively be used.

The first stage has an unusual input stage for each amplifier (A1 and A2) to allow them to work well below ground and to utilise a single PMOS device to be both input (gate) and feedback (source) path, creating a current efficient solution for noise that can work, for example, about 150 mV below GND on a single supply. A switched capacitor input topology may be used for RF immunity requirements of the application. The input devices $MP_{1/2}$ may be in their own well, which is biased through $MP_{3/4}$ to be a $V_{gs}$ above the source to increase the $V_1$ of the input device to provide headroom to work below ground, and which then also allows the cascode device $MP_{5/6}$ to be driven by the same control terminal (gate) voltage as $MP_{1/2}$, while allowing the drain current to be folded to a push-pull output stage (B) which provides the current to the output stage which feeds back via the resistive network ($R_p$/$R_x$/$R_n$) to the input stage $MP_{1/2}$. The bodies of $MP_{1-6}$ track the input, and the feedback network maintains constant current through the input stage, helping THD and allowing the output to sit at an elevated $V_t$ above the input signal without the need for a common mode feedback (CMFB) circuit. The amplifier output in this example is chopped, and may be filtered and buffered (stage 2) en route to the ADC.

Optionally, to correctly track the accuracy of the energy measurement system 100, a voltage channel, which is measuring the line mains voltage at 100s volts using a high ratio (for example, 1000:1) high impedance potential divider 130 also needs monitoring. The purpose of this monitoring circuit is to track the external resistor divider ratio in the background without interruption to the act of measurement. To do this, a small voltage signal $V_s$ may be applied through the bottom end of the potential divider 130. This signal will be divided by the exact same voltage divider ratio as the mains voltage from the top due to super position, and if this signal is detected in digital and removed, can be used to estimate the divider ratio.

Figure 5:
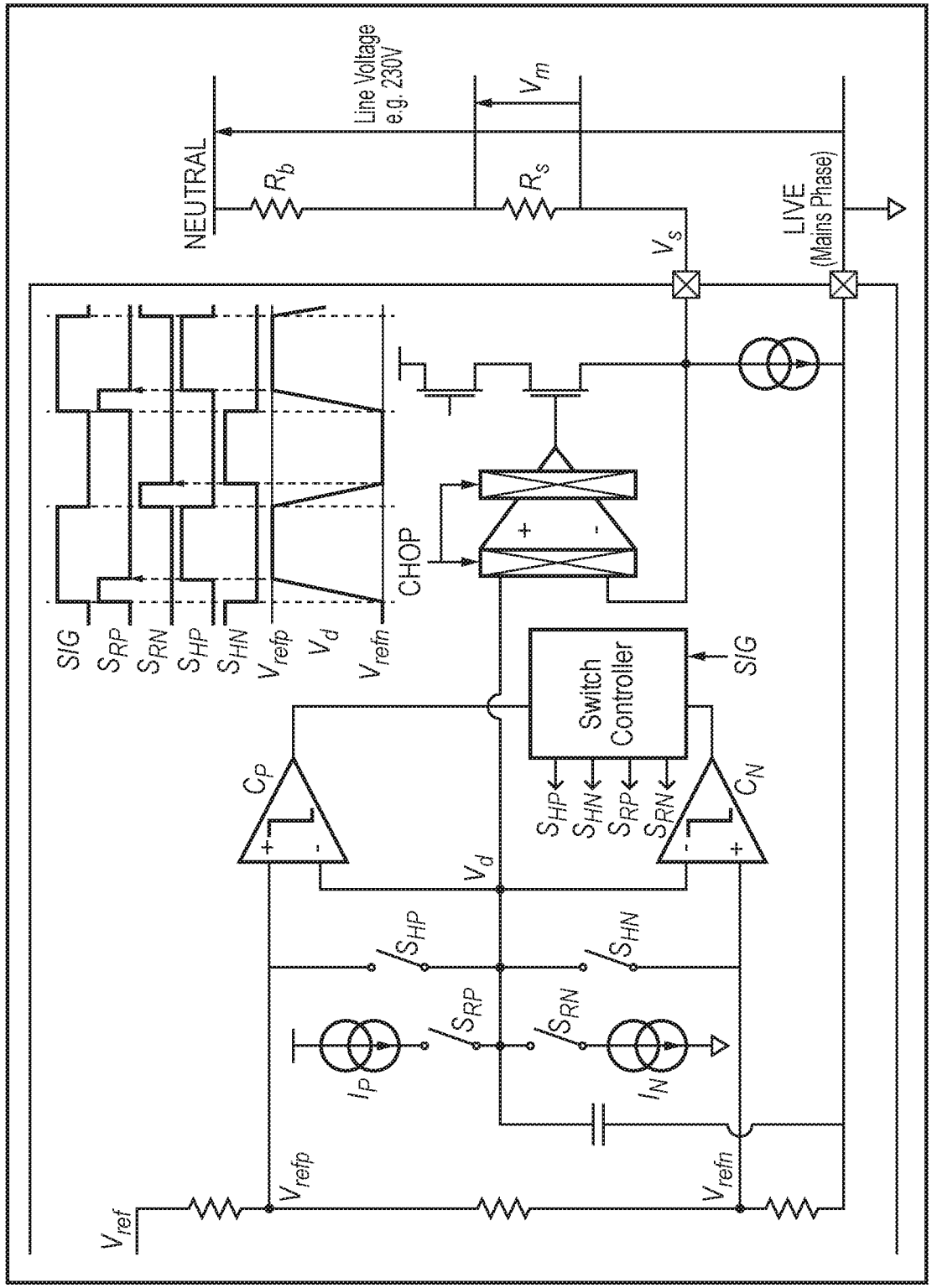
FIG. 5 shows a schematic diagram of an example circuit for tracking the external resistor divider ratio.

FIG. 5 shows this configuration and the circuit used for driving the bottom of the divider 130. The driver derives two voltages $V_{refp}$ and $V_{refn}$ from the voltage reference $V_{ref}$ and under the command of the SIG signal switches the chopper stabilised Class A buffer between the 2 levels. Class A was chosen for this particular example to ensure constant current in GND in order to minimise crosstalk mechanisms. Under control of the SIG signal on the rising edge the pull up current ($I_P$) through $S_{RP}$ to charge the cap to control the slew-rate until when comparator $C_P$ fires the target $V_{refp}$ voltage is switched in through $S_{HP}$, similarly on the falling edge of SIG the pull down current ($I_n$) is switched in to slew the driver down to the $V_{refn}$ level, when the comparator C2 fires and $S_{HN}$ switches over to that. In this way and by altering the current values the slew rate can be constant and controlled between 200 uS and 2 mS, and the handover from slew to settling of the signal has minimum impact back to the reference and to the divider. Not shown in the diagram, the amplifier may have additional low and high side protection to handle surge events on the line which may reach several 1000V.

Figure 6:
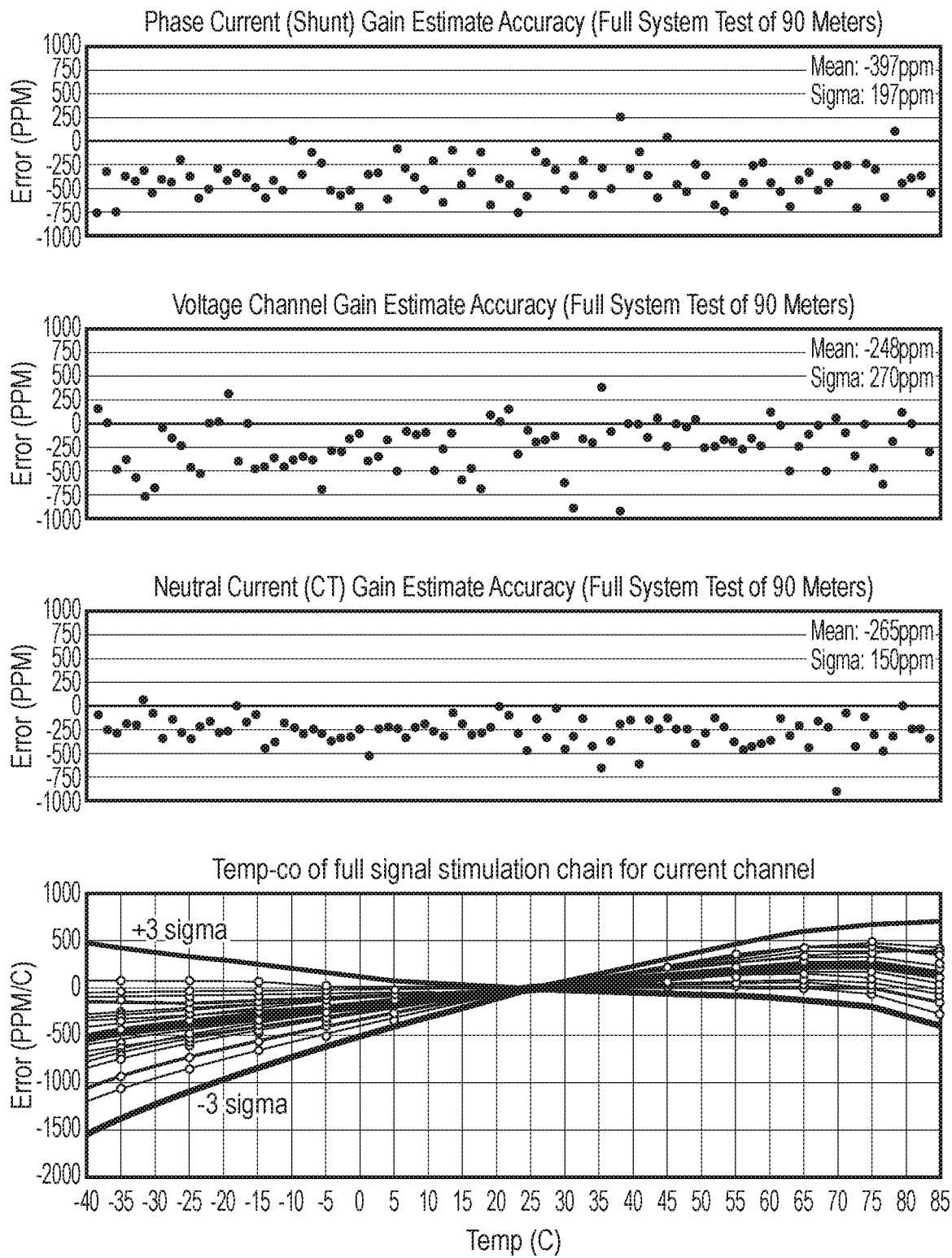
FIG. 6 shows a graphical representation of the performance of the system accuracy tracking.

The complete design including the signal processing and metrology functions may be fabricated in 0.18 u standard CMOS processes, with a die area of 11.8 mm$^2$ including pads (although other suitable processes and die areas may be used). To characterise the performance of the IC at monitoring and tracking the gain of the current and voltage channels including the sensors, the silicon may be integrated in a complete measurement system, an electricity meter, for characterisation. 90 instances of these electricity meters were tested, for the performance of the system accuracy tracking, and the results are shown in FIG. 6. Here for each meter the quality of the ICs ability to estimate the accuracy of the Phase current, Neutral current, and voltage measurement are plotted, and the IC is able to detect the measurement accuracy to better than 0.1% for all channel. This testing was done at room temperature, with different background load signal levels. In addition, the reference stimulation signal, used for gain estimation, changes with temperature which also limits the system's ability to estimate the accuracy of the measurement path. FIG. 6 also shows the temp-co of the full current stimulation paths. Here the temp-co measured is dominated by the bandgap temp-co, and the voltage stimulation channels temp-co was found to match the current channel very closely. Typical electricity meters Class 1, requiring energy measurement accuracy greater than 1%. Here the combination of the error at room, with the addition of temp-co over −40 to +85° C. shows a full energy accuracy monitoring of greater than 0.5% accuracy.

The skilled person will readily appreciate that various alterations or modifications may be made to the above described aspects of the disclosure without departing from the scope of the disclosure.

For example, the V-to-I system 150 described above is used to generate a steady current reference $I_{ref}$ by converting a steady voltage reference $V_{ref-n}$. However, it may alternatively be used to convert any type of voltage signal into a corresponding current.

Furthermore, whilst the V-to-I system 150 described above comprises two or more loops so that a continuous current may be generated and output from the V-to-I system 150, in an alternative the V-to-I system 150 may comprise only a single loop (for example as represented in FIG. 7). In this case, the V-to-I system 150 may output a converted current intermittently (for example, only at the times when $I_1$ is steered to the output of the V-to-I system 150), which may still be useful for some applications that require a converted current only intermittently.

In the example implementation represented in FIG. 2, each of the switches used in the V-to-I system 150 are FETs, although it will be appreciated that any suitable type of controllable switch may alternatively be used. Furthermore, whilst particular frequencies of reference clock Clk are identified above, it will be appreciated that any suitable clock frequency, with any suitable duty cycle, may alternatively be used.

Whilst in the above description, a single integrator 720 and transconductance stage 730 are shared by the two or more loops, in an alternative, two or more integrators and two or more transconductance stages may be used, one for each loop.

Control of the operation of the switches in the V-to-I converter system 150 (i.e., control of the opening and closing of the switches) may be effected directly from the clock signal Clk, or may be performed by any suitable module/entity configured to control the operation of the switches described above, for example a controller in the V-to-I converter system 150, or elsewhere in the wide system/IC.

The terminology of "coupling" used in this disclosure encompasses both direct coupling of components and also indirect coupling of components (i.e., coupling of two components with one or more other components of devices in between).

The claimed invention is:

1. A V-to-I converter system configured to use a received clock signal having a clock cycle to convert an input voltage to an output current, the V-to-I converter system comprising:
a V-to-I conversion unit configured to receive the clock signal and convert the input to a first current;
wherein for a first portion of the clock cycle, the output current comprises the first current and for at least part of the remainder of the clock cycle, the first current is used as a current source to charge the V-to-I conversion unit.

2. The V-to-I converter system of claim 1, wherein the V-to-I conversion unit is further configured to receive the clock signal and convert the input voltage to a second current, and
wherein for a second portion of the clock cycle, the output current comprises the second current and for at least part of the remainder of the clock cycle, the second current is used as a current source to charge the V-to-I conversion unit.

3. The V-to-I converter system of claim 1, wherein the first portion of the clock cycle is approximately 50% of the clock cycle.

4. The V-to-I converter system of claim 2, wherein the V-to-I conversion unit is further configured to receive the clock signal and convert the input voltage to a third current, and
wherein for a third portion of the clock cycle, the output current comprises the third current and for at least part of the remainder of the clock cycle, the third current is used as a current source to charge the V-to-I conversion unit.

5. The V-to-I converter system of claim 4, wherein the first portion of the clock cycle is approximately 33% of the clock cycle, the second portion of the clock cycle is approximately 33% of the clock cycle and the third portion of the clock cycle is approximately the remaining 33% of the clock cycle.

6. The V-to-I converter system of claim 1, further comprising a current steering stage configured to:
steer the first current to the output of the V-to-I converter system during the first portion of the clock cycle and steer the first current to act as the current source for the V-to-I conversion unit for at least part of the remainder of the clock cycle.

7. The V-to-I converter system of claim 1, wherein the V-to-I conversion unit further comprises a first capacitor, and wherein the V-to-I conversion system is configured such that when the first current is used as the current source for the V-to-I conversion unit, the first capacitor is charged by the first current.

8. The V-to-I converter system of claim 1, wherein the V-to-I conversion unit further comprises a first capacitor, and wherein the V-to-I conversion unit further comprises at least one an integrator circuit configured to generate a control voltage based at least in part on the input voltage and a voltage across the first capacitor.

9. The V-to-I converter system of claim 8, wherein the at least one integrator circuit is configured to configured to integrate a difference between the input voltage and the voltage across the first capacitor.

10. The V-to-I converter system of claim 8, wherein the V-to-I conversion unit further comprises a transconductance stage configured to generate the first current based on the control voltage.

11. The V-to-I converter system of claim 10, wherein the transconductance stage is configured to generate the first current based further on a quiescent current.

12. A method of using a V-to-I converter system configured to use a received clock signal having a clock cycle to convert an input voltage to an output current at an output terminal of the V-to-I converter system, the method comprising:
converting, using a V-to-I conversion unit of the V-to-I converter system, the input voltage to a first current, wherein the V-to-I conversion unit is configured to receive the clock signal; and during a first portion of a clock cycle, steering the first current to the output terminal of the V-to-I converter system and during at least part of the remainder of the clock cycle, steering the first current so as to be used as a current source to charge the V-to-I conversion unit.

13. The method of claim 12, further comprising:

converting, using the V-to-I conversion unit of the V-to-I converter system, the input voltage to a second current, wherein the V-to-I conversion unit is configured to receive the clock signal; and during a second portion of the clock cycle, steering the second current to the output terminal of the V-to-I converter system and during at least part of the remainder of the clock cycle, steering the second current so as to be used as a current source to charge the V-to-I conversion unit.

14. The method of claim 13, further comprising:

converting, using a V-to-I conversion unit of the V-to-I converter system, the input voltage to a third current, wherein the V-to-I conversion unit is configured to receive the clock signal; and during a third portion of the clock cycle, steering the third current to the output terminal of the V-to-I converter system and during at least part of the remainder of the clock cycle, steering the third current so as to be used as a current source to charge the V-to-I conversion unit.

15. The method of claim 12, wherein the first portion of the clock cycle is approximately 50% of the clock cycle.

16. The method of claim 12, wherein the first portion of the clock cycle is approximately 33% of the clock cycle.

17. A V-to-I converter system configured to use a received clock signal having a clock cycle to convert an input voltage to an output current, the converter system comprising:

a V-to-I conversion unit comprising:
a first capacitor; and
a second capacitor,
wherein the V-to-I conversion unit is configured to generate a first current and a second current based on the input voltage and charges accumulated in the first capacitor and second capacitor; and a switch stage configured to:
receive the first current and the second current;
steer the first current to the first input of the V-to-I conversion unit during a first portion of the clock cycle in order to charge the first capacitor during the first portion of the clock cycle and steer the first current to an output terminal of the V-to-I converter system during at least part of the remaining portion of the clock cycle; and steer the second current to the second input of the V-to-I conversion unit during a second portion of the clock cycle in order to charge the second capacitor during the second portion of the clock cycle and steer the second current to the output terminal of the V-to-I converter system during at least part of the remaining portion of the clock cycle;

wherein the output current is the current output from the output terminal of the converter system.

18. The system of claim 17, wherein the V-to-I conversion unit further comprises an integrator circuit configured to generate a control voltage by:

integrating a difference between the input voltage and a voltage across the first capacitor during at least part of the first portion of the clock cycle; and integrating a difference between the input voltage and a voltage across the second capacitor during at least part of the second portion of the clock cycle.

19. The system of claim 18, further comprising a transconductance stage configured to generate the first current and the second current based at least in part on the control voltage.

20. The system of claim 17, wherein the first portion of the clock cycle approximately 50% of the clock cycle and the second portion of the clock cycle is approximately the remaining 50% of the clock cycle.

21. The V-to-I converter system of claim 1, wherein the V-to-I conversion unit is a first V-to-I conversion unit, the V-to-I converter system further comprising:

a second V-to-I conversion unit configured to receive an inverse of the clock signal and convert the input voltage to a second current, wherein the inverse of the clock signal has an inverted clock cycle, and wherein for a first portion of the inverted clock cycle, the output current comprises the second current and for at least part of the remainder of the inverted clock cycle, the second current is used as a current source to charge the second V-to-I conversion unit.

22. The V-to-I converter system of claim 21, further comprising:

an integrator circuit configured to receive outputs of the first V-to-I conversion unit and the second V-to-I conversion unit and to generate a control voltage, wherein the integrator circuit is shared by the first V-to-I conversion unit and the second V-to-I conversion unit.

23. The V-to-I converter system of claim 1, wherein the V-to-I conversion unit is a first V-to-I conversion unit, the V-to-I converter system further comprising:

a second V-to-I conversion unit configured to receive the clock signal and convert the input voltage to a second current; and a third V-to-I conversion unit configured to receive the clock signal and convert the input voltage to a third current, wherein for a second portion of the clock cycle, the output current comprises the second current and for at least part of the remainder of the clock cycle, the second current is used as a current source to charge the second V-to-I conversion unit, and wherein for a third portion of the clock cycle, the output current comprises the third current and for at least part of the remainder of the clock cycle, the third current is used as a current source to charge the third V-to-I conversion unit.

* * * * *

UNITED STATES PATENT AND TRADEMARK OFFICE
CERTIFICATE OF CORRECTION

PATENT NO. : 10,845,832 B2  
APPLICATION NO. : 16/562141  
DATED : November 24, 2020  
INVENTOR(S) : Jonathan Ephraim David Hurwitz Page 1 of 1

It is certified that error appears in the above-identified patent and that said Letters Patent is hereby corrected as shown below:

In the Claims

In Column 15, Line 65, in Claim 1, after "input", insert --voltage--

In Column 16, Line 51, in Claim 9, delete "configured to configured to" and insert --configured to-- therefor In Column 17, Line 61, in Claim 17, after "the", insert --V-to-I--

In Column 18, Line 16, in Claim 20, after "cycle", insert --is--

Signed and Sealed this  
Second Day of March, 2021

Drew Hirshfeld  
*Performing the Functions and Duties of the*  
*Under Secretary of Commerce for Intellectual Property and*  
*Director of the United States Patent and Trademark Office*